(12) United States Patent
Honsowetz (10) Patent No.: US 12,194,932 B2
(45) Date of Patent: Jan. 14, 2025

(54) ELECTRICAL ASSEMBLY

(71) Applicant: Lear Corporation, Southfield, MI (US)

(72) Inventor: Eric Honsowetz, Redford, MI (US)

(73) Assignee: Lear Corporation, Southfield, MI (US)

( * ) Notice: Subject to any disclaimer, the term of this patent is extended or adjusted under 35 U.S.C. 154(b) by 1441 days.

(21) Appl. No.: 16/401,625

(22) Filed: May 2, 2019

(65) Prior Publication Data

US 2020/0346597 A1    Nov. 5, 2020

(51) Int. Cl.
| | |
|---|---|
| *B60R 16/023* | (2006.01) |
| *B60N 2/02* | (2006.01) |
| *B60N 2/04* | (2006.01) |
| *B60R 16/037* | (2006.01) |
| *H03K 17/082* | (2006.01) |

(52) U.S. Cl.
CPC ........ *B60R 16/023* (2013.01); *B60N 2/02246* (2023.08); *B60N 2/0228* (2013.01); *B60N 2/04* (2013.01); *B60R 16/037* (2013.01); *H03K 17/0822* (2013.01); *B60N 2/02253* (2023.08)

(58) Field of Classification Search
CPC ....... B60R 16/037; B60R 16/023; B60N 2/04; B60N 2/0232; B60N 2/0228; B60N 2/0236; H03K 17/0822
See application file for complete search history.

(56) References Cited

U.S. PATENT DOCUMENTS

| | | | |
|---|---|---|---|
| 4,965,550 A | 10/1990 | Wroblewski | |
| 5,621,250 A | 4/1997 | Kim | |
| 5,894,207 A * | 4/1999 | Goings | B60N 2/002 318/478 |
| 6,335,577 B1 | 1/2002 | Baba | |
| 6,339,302 B1 * | 1/2002 | Greenbank | B60N 2/0228 318/103 |
| 6,393,571 B1 | 5/2002 | Huckfeldt et al. | |
| 6,738,914 B2 | 5/2004 | Christopher | |
| 6,762,595 B2 | 7/2004 | Tamai et al. | |
| 9,381,923 B2 | 7/2016 | Suzuki et al. | |
| 9,573,540 B2 | 2/2017 | Kanzaki et al. | |

(Continued)

FOREIGN PATENT DOCUMENTS

| | | | |
|---|---|---|---|
| CN | 205737359 U | * | 11/2016 |
| CN | 206358095 U | | 7/2017 |

(Continued)

*Primary Examiner* — Peter D Nolan
*Assistant Examiner* — Demetra R Smith-Stewart
(74) *Attorney, Agent, or Firm* — Fishman Stewart PLLC (57) ABSTRACT

An electrical assembly includes a primary controller, a secondary controller, and a switch assembly. The primary controller, the secondary controller, and/or the switch assembly may be electrically connected, and/or the secondary controller may be configured to control the primary controller according to a position of a switch of the switch assembly. The switch assembly may be connected to the primary controller, and/or the primary controller may be configured to control movement of a vehicle seat according to the position of the switch. The primary controller may include a first state and/or a second state; and the primary controller may be configured to instruct the secondary controller to change the primary controller from the second state to the first state. The first state of the primary controller may be a low power mode.

20 Claims, 6 Drawing Sheets

(56) References Cited

U.S. PATENT DOCUMENTS

| | | | |
|---|---|---|---|
| 9,932,002 B2 | 4/2018 | Aoki | |
| 10,093,197 B2 | 10/2018 | Deljevic et al. | |
| 10,682,927 B1* | 6/2020 | Krueger | B60N 2/0296 |
| 2012/0226418 A1* | 9/2012 | Veen | B60N 2/976 |
| | | | 297/217.3 |
| 2016/0059807 A1 | 3/2016 | Iwasaki et al. | |
| 2018/0029502 A1* | 2/2018 | Georgiev | B60N 2/0228 |
| 2018/0229740 A1* | 8/2018 | Matsumoto | B60N 2/002 |
| 2018/0295011 A1* | 10/2018 | Wang | H04L 41/0833 |
| 2018/0326931 A1 | 11/2018 | Naganishi et al. | |
| 2019/0157977 A1* | 5/2019 | Balakrishnan | H02M 3/33523 |
| 2019/0283643 A1* | 9/2019 | Gerharz | B60N 2/976 |
| 2020/0062146 A1* | 2/2020 | Freienstein | B60R 21/01554 |
| 2021/0291700 A1* | 9/2021 | Okada | B60N 2/1635 |

FOREIGN PATENT DOCUMENTS

| | | | | |
|---|---|---|---|---|
| CN | 207015199 U | * | 2/2018 | |
| DE | 10133802 C1 | | 12/2002 | |
| DE | 10033037 B4 | | 4/2005 | |
| DE | 102017207858 B3 | | 7/2018 | |
| EP | 931702 A2 | * | 7/1999 | B60R 1/07 |
| WO | WO-2018075066 A1 | * | 4/2018 | B60N 2/0232 |

* cited by examiner

ELECTRICAL ASSEMBLY

TECHNICAL FIELD

The present disclosure generally relates to electrical assemblies, including electrical assemblies that may be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may be relatively complex and/or may not provide sufficient functionality. Some electrical assemblies may not be configured to control a primary controller via a secondary controller and/or a switch assembly.

There is a desire for solutions/options that minimize or eliminate one or more challenges or shortcomings of electrical assemblies. The foregoing discussion is intended only to illustrate examples of the present field and should not be taken as a disavowal of scope.

SUMMARY

In embodiments, an electrical assembly may include a primary controller, a secondary controller, and/or a switch assembly. The primary controller, the secondary controller, and/or the switch assembly may be electrically connected, and/or the secondary controller may be configured to control the primary controller according to a position of a switch of the switch assembly. The switch assembly may be connected to the primary controller, and/or the primary controller may be configured to control movement of a vehicle seat according to the position of the switch. The primary controller may include a first state and/or a second state; and the primary controller may be configured to instruct the secondary controller to change the primary controller from the second state to the first state. The first state of the primary controller may be a low power mode. The switch assembly may be configured to provide a return signal to the secondary controller. The secondary controller may be configured to change the primary controller from a first state to a second state according to the return signal.

With embodiments, the primary controller may include and/or be connected to one or more analog to digital converters; and/or the one or more analog to digital converters may be configured to convert return signals from the switch assembly from analog signals to digital signals. The secondary controller may include one or more digital inputs; and/or the one or more digital inputs may include a first threshold and/or a second threshold. When a return signal from the switch assembly is greater than the first threshold, the secondary controller may be configured to maintain the primary controller in a first state and/or change the primary controller from a second state to the first state. When the return signal from the switch assembly is less than the second threshold; the secondary controller may be configured to maintain the primary controller in the second state and/or change the primary controller from the first state to the second state.

In embodiments, the secondary controller may be configured to send a cyclic monitoring signal to the switch assembly; and/or the secondary controller may be configured to compare a first value corresponding to a return signal from the switch assembly with a second value corresponding to a previous return signal from the switch assembly. If the first value is different than the second value, the secondary controller may be configured to change a state of the primary controller. The switch assembly may include a first switch; and/or the first switch may include an input, an output, a first resistor, a second resistor, and/or a third resistor. The first switch may be configured to move between a first position, a second position, and/or a third position. In the first position, the input may be connected to the output via the first resistor, the second resistor, and/or the third resistor in series. In the second position, the input may be connected to the output via the first resistor and/or the second resistor in series. In the third position, the input may be connected to the output via the first resistor.

With embodiments, a first output resistor may be connected between a first output of the secondary controller and/or the input of the switch assembly. A first input resistor may be connected between the output of the switch assembly and/or a first input of the secondary controller. The secondary controller may be configured to selectively supply power to the primary controller. A method of operating an electrical assembly may include providing a primary controller, a secondary controller, and/or a first switch. The method may include receiving, at a digital input of the secondary controller, an analog return signal from the first switch, and/or determining a position of the first switch based on the analog return signal. The method may include selectively providing power to the primary controller via the secondary controller that may be based on the position of the first switch. The first switch may include a first position, a second position, and/or a third position. The secondary controller may be configured to provide power to the primary controller if the first switch changes from the first position to the second position and/or if the first switch changes from the first position to the third position. The secondary controller may be configured to send a cyclic power signal to the first switch. The secondary controller may be configured to receive a signal from the primary controller that may activate a low power mode of the primary controller. The primary controller may be configured to receive an analog signal from the first switch, and/or the primary controller may be configured to convert the analog signal into a digital signal. The primary controller may be configured to move a seat based on the digital signal.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
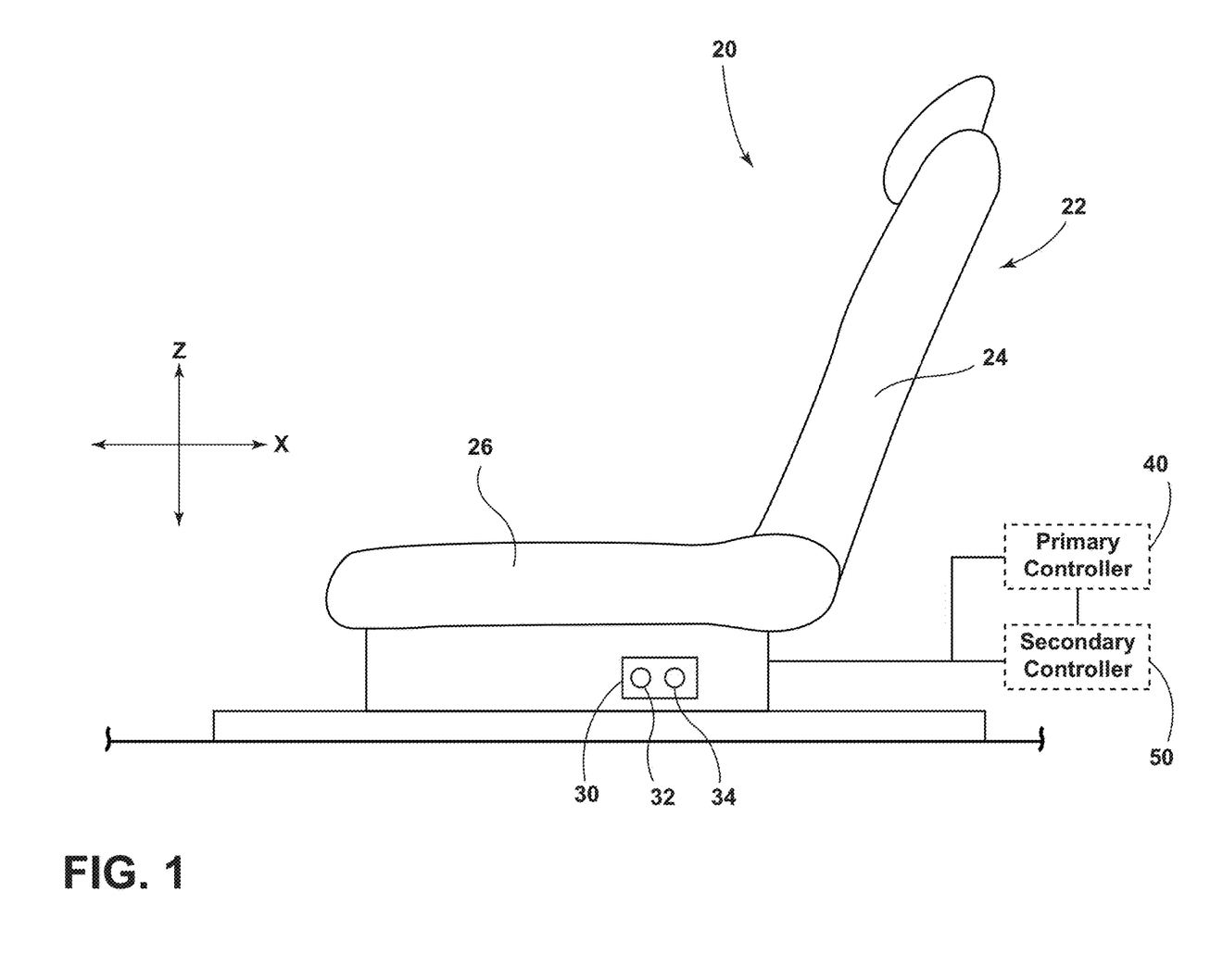
FIG. 1 is a side view generally illustrating an embodiment of an electrical assembly according to teachings of the present disclosure.
Figure 2:
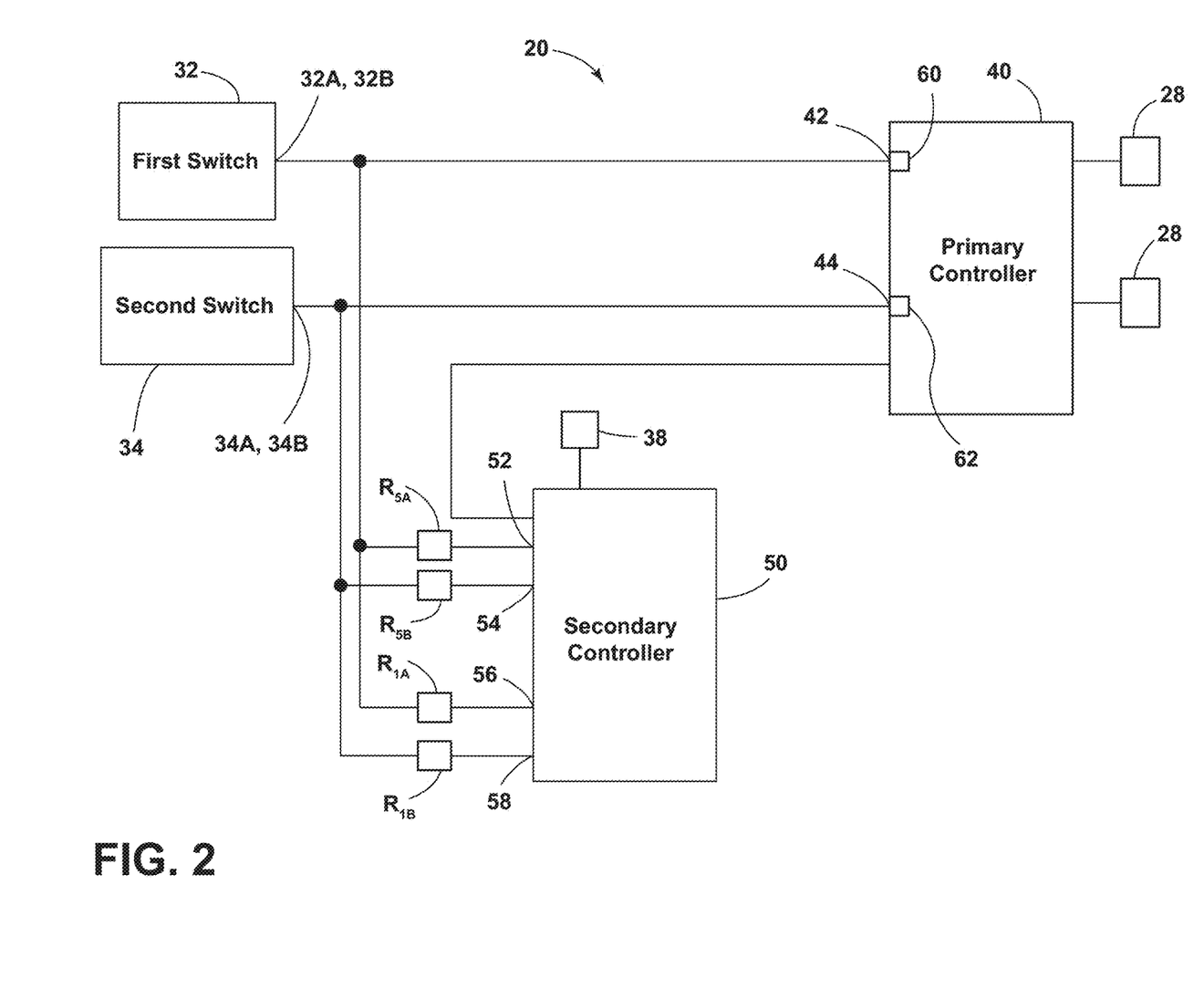
FIG. 2 is a schematic generally illustrating an embodiment of an electrical assembly according to teachings of the present disclosure.

In embodiments, such as generally illustrated in FIGS. 1 and 2, an electrical assembly 20 may include a switch assembly 30, a first/primary controller 40, and/or a second/secondary controller 50. The switch assembly 30 may be connected to one or more of a variety of outputs or loads. For example and without limitation, the switch assembly 30 may be configured for controlling operation of a vehicle seat 22, such as one or more motors 28 that may be connected to move/fold the seat 22. The switch assembly 30 may be disposed on and/or connected to an outer portion of the vehicle seat 22. The switch assembly 30 may be configured to effect movement (e.g., rotation, translation, folding, etc.) of a seat in a first direction (e.g., forward) and/or a second direction (e.g., rearward). The primary controller 40 may be connected to the secondary controller 50 and/or the switch assembly 30. For example and without limitation, a first switch 32 of the switch assembly 30 may be connected to a first input 42 of the primary controller 40 and/or a second switch 34 of the switch assembly 30 may be connected to a second input 44 of the primary controller 40. The secondary controller 50 may be connected to the switch assembly 30. For example and without limitation, a first input 52 and a first output 56 of the secondary controller 50 may be connected to an output 32A and an input 32B, respectively, of the first switch 32. A second input 54 and a second output 58 of the secondary controller 50 may be connected to an output 34A and an input 34B, respectively, of the second switch 34. The secondary controller 50 may be configured to selectively activate/deactivate the primary controller 40.

With embodiments, such as generally illustrated in FIG. 2, the electrical assembly 20 may include a primary controller 40. The primary controller 40 may be configured to carry out various functions associated with a vehicle and/or a vehicle seat 22. For example and without limitation, the primary controller 40 may be configured to actuate a vehicle seat 22 (e.g., according to inputs 32B, 34B from the switch assembly 30). The primary controller 40 may be configured to provide one or more additional functions, such as controlling one or more vehicle systems and/or components. The primary controller 40 may include a first state and/or a second state. In the first state, the primary controller 40 may be off and/or may be in a low power mode. The primary controller 40 may be in the first state (e.g., off) when full functionality of the primary controller 40 is not desired/required. The primary controller 40 may be in the first state to save energy and/or power until operation/functionality of the primary controller 40 is requested and/or required. The primary controller 40 may be in a second state (e.g., on) when operation of the primary controller 40 is required and/or requested. In the second state, the primary controller 40 may be configured to control movement of the seat 22, such as if requested via the switch assembly 30. In the second state, the primary controller 40 may use more power than the secondary controller 50. If the primary controller 40 is in the first state, the primary controller 40 may not be configured to control movement of the seat 22 and/or input 32B, 34B from the switch assembly 30 may not, at least initially, be received by the primary controller 40 (e.g., inputs 42, 44 of the primary controller 40 corresponding to the switch assembly 30 may not be active when the primary controller 40 is in the first state). The primary controller 40 may be configured to communicate with the secondary controller 50, and/or may be electrically connected with and/or to the secondary controller 50.

In embodiments, such as generally shown in FIG. 2, the electrical assembly 20 may include a secondary controller 50. The secondary controller 50 may include one or more of a variety of chips, controllers, and/or electrical components. For example and without limitation, the secondary controller 50 may be configured as a system basis chip. The secondary controller 50 may be electrically connected to the switch assembly 30 and/or the primary controller 40. The secondary controller 50 may be configured to communicate with the primary controller 40. The secondary controller 50 may be connected to a power source 38, such as a vehicle battery and/or may not be powered via the primary controller 40. The secondary controller 50 may be connected to the primary controller 40 such as to selectively provide power from the power source 38 to the primary controller 40. For example and without limitation, the secondary controller 50 may provide a 5-volt supply to the primary controller 40.

With embodiments, the secondary controller 50 may be configured to control the state of the primary controller 40, such as via selectively providing power to the primary controller 40 according to instructions received from the primary controller 40. The secondary controller 50 may receive instructions from the primary controller 40 to change the state of the primary controller 40 from the second state to the first state. For example and without limitation, the primary controller 40 may determine that the primary controller 40 should switch to a low power mode (e.g., the first state) and may provide an instruction/indication (e.g., information, data, a signal, etc.) to the secondary controller 50 to switch the primary controller 40 to the first state. The secondary controller 50 may then stop providing power to the primary controller 40 and/or provide less power to the primary controller 40, which may result in the primary controller 40 changing to the first state.

In embodiments, the secondary controller 50 may be configured to cause the first controller 40 to change from the first state to the second state (e.g., "wake up" the primary controller 40), such as if functionality provided via the primary controller 40 is requested. For example and without limitation, if a user wants to move a seat 22, the user may actuate the switch assembly 30. If the primary controller 40 is in the first state, the primary controller 40 may not receive information from the switch assembly 30 and/or may not be able to control the seat 22. The secondary controller 50 may receive information from the switch assembly 30 (e.g., that seat movement is desired) and may change the primary controller 40 from the first state to the second state. With some configurations, the primary controller 40 may instruct the secondary controller 50 to set the primary controller 40 to a low power mode, and/or the secondary controller 50 may determine when to wake up/turn on the primary controller 40 (e.g., to a full power mode).

With embodiments, the secondary controller 50 may be configured monitor the switch assembly 30 to determine if the switch assembly 30 has been actuated. For example and without limitation, the secondary controller 50 may be configured to provide one or more monitoring signals (e.g., a cyclic and/or non-cyclic power outputs) to the switch assembly 30. The secondary controller 50 may be configured to provide a first monitoring signal from the first output 56 to the input 32B of the first switch 32 and/or may provide a second monitoring signal from the second output 58 to the input 34B of the second switch 34. The switch assembly 30 may provide a response (e.g., a return signal or resistance) that may correspond to the position of the switch 32, 34. For example and without limitation, the first switch 32 may provide a first return signal or resistance from the output 32A of the first switch 32 to the first input 52 of the secondary controller 50, and/or the second switch 34 may provide a second return signal or resistance from the output 34A of the second switch 34 to the second input 54 of the secondary controller 50.

In embodiments, the secondary controller 50 may provide the one or more monitoring signals continuously or may provide the monitoring signal periodically. Providing the monitoring signals periodically may reduce power consumption. For example and without limitation, the secondary controller 50 may provide the monitoring signals about every 50 ms to check the status of the switch assembly 30.

With embodiments, such as generally shown in FIGS. 2, 3A, 3B, and 3C, the switch assembly 30 may include one or more switches, such as a first switch 32 and/or a second switch 34. The electrical assembly 20 may include a single switch, two switches, or more than two switches. The first switch 32 and/or the second switch 34 may be connected to a vehicle seat 22. For example and without limitation, the first switch 32 and/or the second switch 34 may be disposed at the side of a seat 22 for an occupant to move the seat 22. Moving the seat 22 may include movement in the X-direction, the Z-direction, tilting/folding the seat back 24, and/or tilting the seat base 26, among other movements. The first switch 32 may correspond to a first direction of seat movement, and/or the second switch 34 may correspond to a second direction of seat movement. The first switch 32 may not be connected to the second switch 34, and/or each of the first switch 32 and/or the second switch 34 may be connected to the primary controller 40 and the secondary controller 50. The first switch 32 and/or the second switch 34 may be configured to send information to the primary controller 40 and/or the secondary controller 50. When the first switch 32 and/or the second switch 34 is not engaged/actuated, the primary controller 40 may be in the first state. For example, when movement of the seat 22 is not requested, the primary controller 40 may be off and/or in low power mode. When the first switch 32 and/or the second switch 34 is actuated to a second position or third position, the secondary controller 50 may change the primary controller 40 from the first state to the second state. The primary controller 40 may be connected to a motor 28 to move the seat 22 corresponding to return signals from the first switch 32 and/or the second switch 34.

Figure 3A:
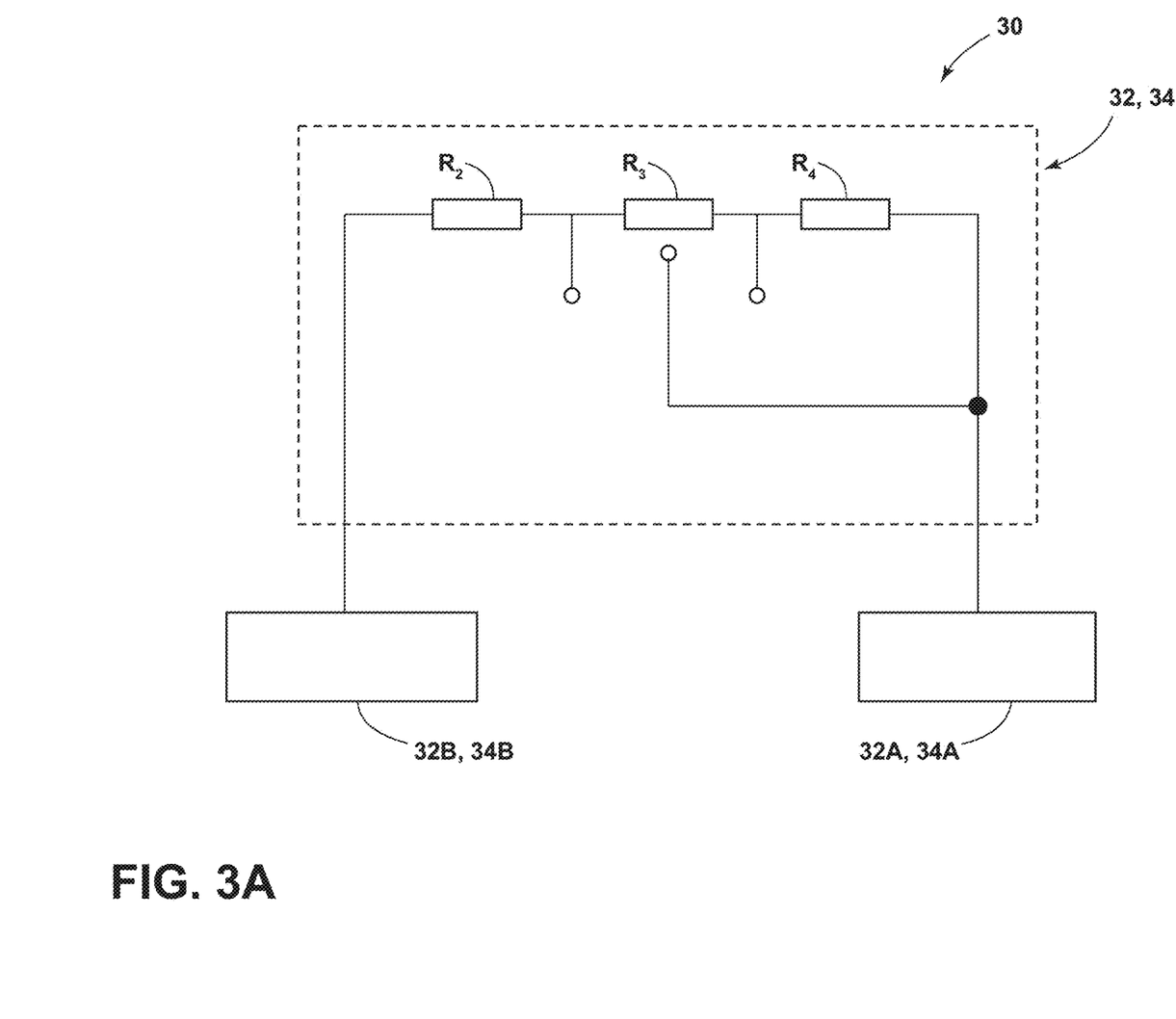
FIG. 3A is a schematic generally illustrating portions of an embodiment of an electrical assembly according to teachings of the present disclosure.
Figure 3B:
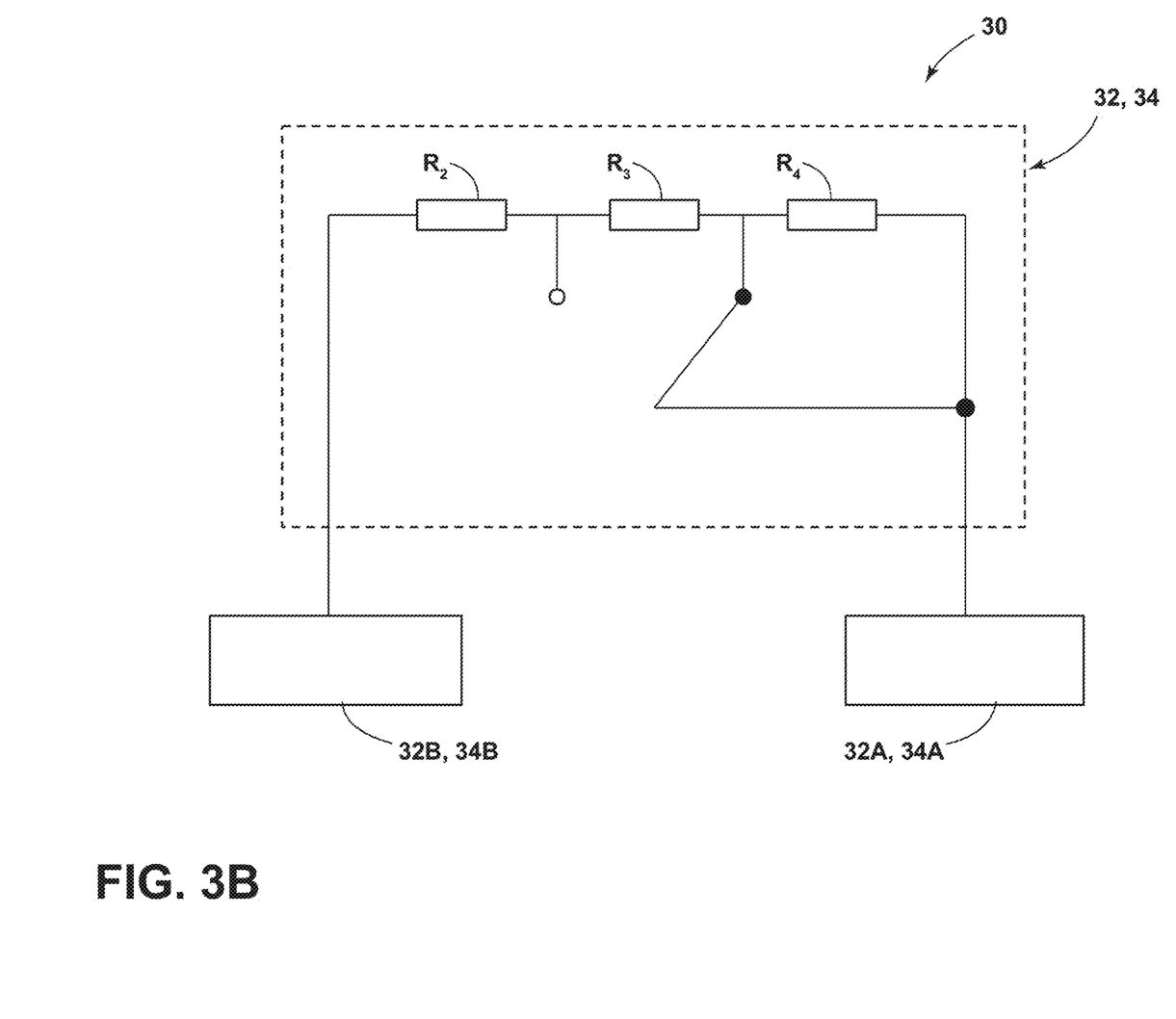
FIG. 3B is a schematic generally illustrating portions of an embodiment of an electrical assembly according to teachings of the present disclosure.
Figure 3C:
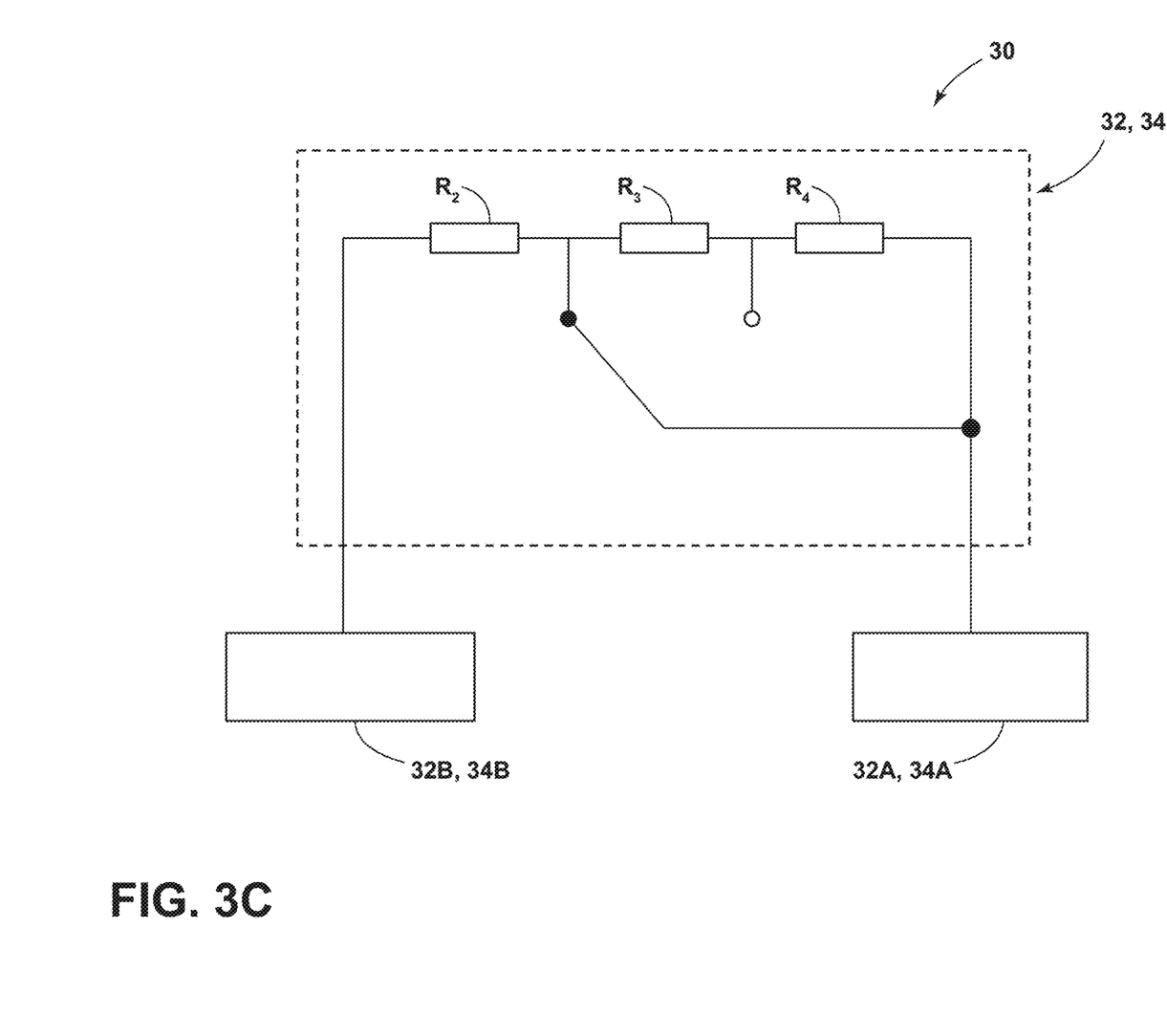
FIG. 3C is a schematic generally illustrating portions of an embodiment of an electrical assembly according to teachings of the present disclosure.

In embodiments, the first switch 32 and/or second switch 34 may have a first position (see, e.g., FIG. 3A), a second position (see, e.g., FIG. 3B), and/or a third position (see, e.g., FIG. 3C). The first switch 32 and/or the second switch 34 may include an input 32B, 34B, an output 32A, 34A, a first resistor $R_2$, a second resistor $R_3$, and/or a third resistor $R_4$. The first resistor $R_2$, the second resistor $R_3$, and/or the third resistor $R_4$ may be connected in series. The switch 32, 34 may be open when the switch 32, 34 is in the first position such that the input 32B, 34B is connected to the output 32A, 34A via the first resistor $R_2$, the second resistor $R_3$, and the third resistor $R_4$ connected in series. When the switch 32, 34 is in the second position, the switch 32, 34 may effectively short the third resistor $R_4$, such that the input 32B, 34B may be connected to the output 32A, 34A via (i) the first resistor $R_2$ and the second resistor $R_3$ connected in series (e.g., with the second resistor $R_3$ connected directly to the output 32A, 34A), and (ii) the first resistor $R_2$, the second resistor $R_3$, and the third resistor $R_4$ connected in series. In the second position, the switch 32, 34 may provide a lower total resistance than when the switch 32, 34 is in the first position. When the switch 32, 34 is in the third position, the switch 32, 34 may effectively short the second resistor $R_3$ and the third resistor $R_4$ such that the input 32B, 34B may be connected to the output 32A, 34A via (i) the first resistor $R_2$ (e.g., with the first resistor $R_2$ connected directly to the output 32A, 34A), and (ii) the first resistor $R_2$, the second resistor $R_3$, and the third resistor $R_4$ connected in series. In the third position, the switch 32, 34 may provide a lower total resistance than when the switch 32, 34 is in the second position. The resistance of the switch 32, 34 may be the greatest when the switch 32, 34 is in the first position, and/or the resistance of the switch 32, 34 may be the least when the switch 32, 34 is in the third position.

In embodiments, the first switch 32 and/or the second switch 34 may be electrically connected to both of the primary controller 40 and the secondary controller 50. The first switch 32 and/or the second switch 34 may provide analog signals/data (e.g., return signals) to the primary controller 40 and/or the secondary controller 50. The first switch 32 and/or the second switch 34 may be connected to a first analog to digital (A/D) converter 60 and/or a second A/D converter 62, respectively. The first A/D converter 60 and/or the second A/D converter 62 may be disposed in and/or outside of the primary controller 40. When the primary controller 40 is in the second state, the primary controller 40 may receive analog data from the first switch 32 and/or the second switch 34. The A/D converters 60, 62 may convert the analog data into digital data, and/or the digital data may be used by the primary controller 40 to command the one or motors 28 (e.g., speed, direction, etc.).

With embodiments, such as generally illustrated in FIGS. 2, 3A, 3B, and 3C, the secondary controller 50 may determine whether to activate/turn on the primary controller 40 (e.g., the second state) based on a return signal from the switch assembly 30. A first input 52 and/or a second input 54 of the secondary controller 50 may be digital inputs and/or may include thresholds to which received signals (e.g., return signals from the switch assembly 30) may be compared and/or at which received signals may be recognized. For example and without limitation, the first input 52 and/or the second input 54 of the secondary controller 50 may include a first/high threshold of about 60% of the monitoring signal and/or a second/low threshold of about 40% of the monitoring signal. The monitoring signals may include a voltage of about 1 V, which may correspond to the first threshold equaling about 0.6 V and the second threshold equaling about 0.4 V. If a signal received at the secondary controller inputs 52, 54 are at or above the first/high threshold, the inputs 52, 54 may recognize the signal as in a high state, which may correspond to a value of 1. If a signal received at the secondary controller inputs 52, 54 are at or below the second/low threshold, the inputs 52, 54 may recognize the signal as in a lower state, which correspond to a value of 0.

In embodiments, if a switch 32, 34 is in a first position, the return signal may be at or above the first threshold (e.g., at least 60% of the monitoring signal), the secondary controller 50 may recognize the return signal as a high signal, and/or may store the first value as the current status/state of the switch 32, 34. If a switch 32, 34 is in a second position or a third position, the return signal may be at or below the second threshold (e.g., 40% of the monitoring signal of less), the secondary controller 50 may recognize the return signal as a low signal, and/or may store the second value as the current status/state of the switch 32, 34.

With embodiments, the secondary controller 50 may continue to monitor the switch assembly 30, which may include continuing to provide one or more monitoring signals (e.g., cyclic/periodic signals and/or non-cyclic signals) to the switch assembly 30 and storing the status/state of one or more switches 32, 34. If the return signal from a switch 32, 34 corresponds to a different status/state than the previously stored status/state, the secondary controller 50 may determine that the corresponding switch 32, 34 has changed states. The secondary controller 50 may provide an indication of the change to the primary controller 40 and/or, if the change was from a first position to a second position or third position, the secondary controller 50 may activate the primary controller 40. Once activated, the primary controller 40 may control movement of a seat 22 according to the position of the switch 32, 34. If the primary controller 40 receives an indication from the secondary controller 50 that some or all switches 32, 34 are in the first position, the primary controller 40 may instruct the secondary controller 50 to turn of the primary controller 40.

With embodiments, the first switch 32 and/or the second switch 34 may include resistors $R_2$, $R_3$, $R_4$. The resistances of the resistors $R_2$, $R_3$, $R_4$ may correspond to the return signal provided by the switch 32, 34. The electrical assembly 20 may include a first output resistor $R_{1A}$, a second output resistor $R_{5B}$, a first input resistor $R_{5A}$, and/or a second input resistor $R_{5B}$. The first output resistor $R_{1A}$ and/or the second output resistor $R_{1B}$ may be referred to generally as $R_1$. The first input resistor $R_{5A}$ and/or the second input resistor $R_{5B}$ may be referred to generally as $R_5$. The first output resistor $R_1$ may be connected to the first output 56 of the secondary controller 50 and the input 32B of the first switch 32. The first input resistor $R_5$ may be connected to the output 32A of the first switch 32 and the first input 52 of the secondary controller 50. The second output resistor $R_1$ may be connected to the second output 58 of the secondary controller 50 and the input 34B of the second switch 34. The second input resistor $R_5$ may be connected to the second input 54 of the secondary controller 50 and the output 34A of the second switch 34.

In embodiments, the digital inputs 52, 54 of the secondary controller 50 may be sensitive to current and/or voltage. If the first input 52 and/or the second input 54 of the secondary controller 50 are current sensitive, the first input resistor $R_5$ and the second input resistor $R_5$ may be configured to make the return signal compatible with and/or recognizable by the first input 52 and the second input 54, respectively. For example and without limitation, the first input resistor $R_5$ and/or the second input resistor $R_5$ may each have a resistance of about 5.9 kΩ or more or less.

With embodiments, the output resistors $R_1$, which may be referred to as match resistors $R_1$, may be configured to provide respective resistances for the electrical assembly 20 to facilitate recognition of analog return signals by digital inputs 52, 54 of the secondary controller 50. For example and without limitation, an output resistor $R_1$ may provide a resistance such when a switch 32, 34 is in the first position, the return signal is at or above the first threshold and such that when the switch 32, 34 is in the second position or the third position, the return signal is at or below the second threshold. For example and without limitation, the first output resistor $R_1$ and/or the second output resistor $R_1$ may be about 6.34 kΩ or more or less.

Figure 4A:
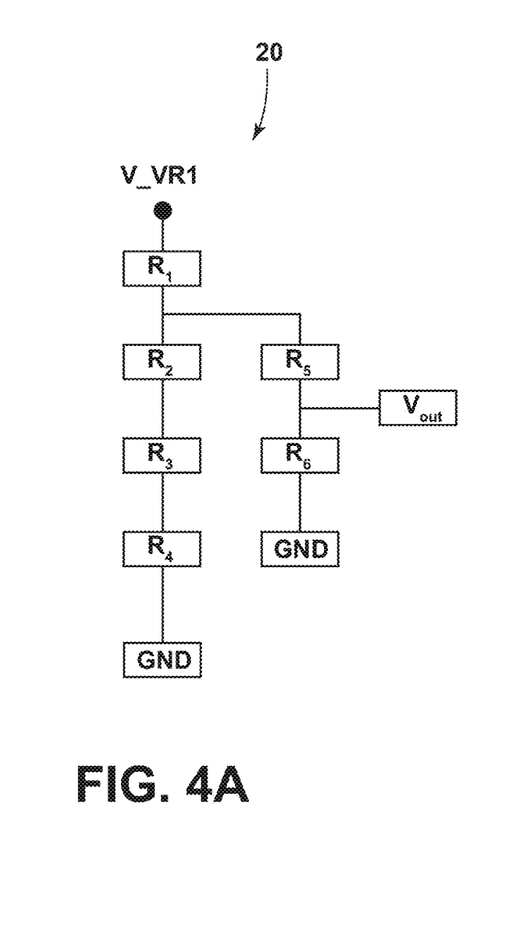
FIG. 4A is a schematic generally illustrating portions of an embodiment of an electrical assembly according to teachings of the present disclosure.
Figure 4B:
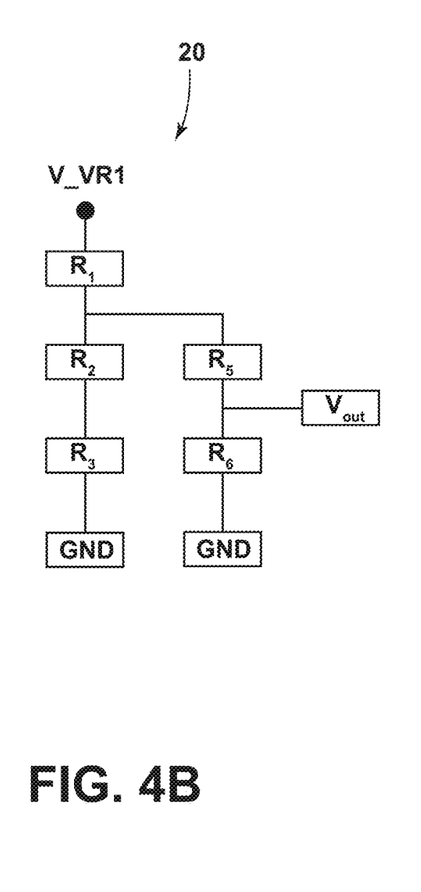
FIG. 4B is a schematic generally illustrating portions of an embodiment of an electrical assembly according to teachings of the present disclosure.
Figure 4C:
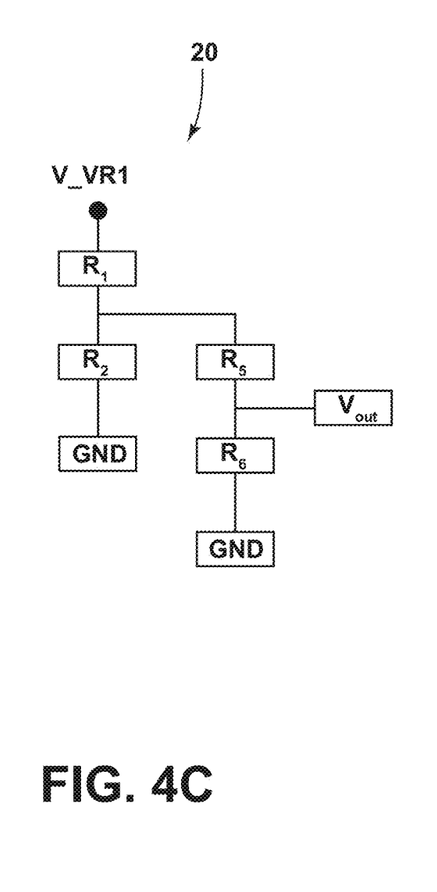
FIG. 4C is a schematic generally illustrating portions of an embodiment of an electrical assembly according to teachings of the present disclosure.

In embodiments, such as generally illustrated in FIGS. 4A, 4B, and 4C the position of the first switch 32 and/or the second switch 34 may change the overall resistance, current, and/or voltage of the electrical assembly 20. When the switch 32, 34 is in the first position, an example of a resulting circuit is generally illustrated in FIG. 4A. When the switch 32, 34 is in the second position, an example of a resulting circuit is generally illustrated in FIG. 4B. When the switch 32, 34 is in the third position, an example of a resulting circuit is generally illustrated in FIG. 4C. Exemplary values of the resistors $R_1$, $R_2$, $R_3$, $R_4$, $R_5$, $R_6$ are provided, for illustrative purposes only, in Table 1. Resistor $R_6$ may be configured as a pull down resistor and/or may be included with the secondary controller 50. The resulting voltage percentages $V_1$, $V_2$, $V_3$ of the return signal when the switch 32, 34 is in the first position, the second position, and the third position of the switch may be represented by Equations 1, 2, and 3, respectively, with embodiments.

$$V_1 = V_{VR1}\left(\frac{RS1R5}{R1 + RS1R5} \times \frac{R6}{R5 + R6}\right) \quad \text{Eq. 1}$$

$$V_2 = V_{VR1}\left(\frac{RS2R5}{R1 + RS2R5} \times \frac{R6}{R5 + R6}\right) \quad \text{Eq. 2}$$

$$V_3 = V_{VR1}\left(\frac{R2R5}{R1 + RS2R5} \times \frac{R6}{R5 + R6}\right) \quad \text{Eq. 3}$$

In embodiments, the resistances be selected such that Equation 1 results in a value greater than or equal to the first threshold (e.g., 0.6), and Equation 2 and Equation 3 result in values less than or equal to the second threshold (e.g., 0.4).

TABLE 1

| Symbol | Name | Min. | Typ. | Max. | Unit |
|---|---|---|---|---|---|
|  | V_VR1 | 1 | 1 | 1 | V |
| R1 | R1 | 6149.8 | 6340 | 6530.2 | Ohms |
| R2 | R2 | 1231.9 | 1270 | 1308.1 | Ohms |
| R3 | R3 | 2851.8 | 2940 | 3028.2 | Ohms |
| R4 | R4 | 8196.5 | 8450 | 8703.5 | Ohms |
| R5 | R5 --- SBC Current Limit | 5723 | 5900 | 6077 | Ohms |
| R6 | R6 --- SBC Pull Down | 100000 | 270000 | 450000 | Ohms |
| RS1 | R2 + R3 + R4 | 12280.2 | 12660 | 13039.8 | Ohms |
| RS2 | R2 + R3 | 4083.7 | 4210 | 4336.3 | Ohms |
| R5 + R6 | R5 + R6 | 105723 | 275900 | 456077 | Ohms |
| RS1R5 | (1/((1/R5 + R6) + (1/(R2 + R3 + R4)))) | 11002 | 12105 | 12677 | Ohms |
| RS2R5 | (1/((1/R5 + R6) + (1/(R2 + R3)))) | 3932 | 4147 | 4295 | Ohms |
| R2R5 | (1/((1/R5 + R6) + (1/(R2)))) | 1218 | 1264 | 1304 | Ohms |

In embodiments, the switch assembly 30 may be connected to the secondary controller 50 without an analog-to-digital converter. For example and without limitation, the resistors $R_2$, $R_3$, $R_4$ of the switch assembly 30, the output resistors $R_1$, and/or the input resistors $R_2$ may be configured to be used instead of or to replace such converters.

With embodiments, a method of operating an electrical assembly 20 may include providing a primary controller 40, a secondary controller 50, and/or a switch assembly 30. The method may include sending a monitoring signal (e.g., cyclic output) to a first switch 32 of the switch assembly 30, and/or receiving, at a digital input 52, 54 of the secondary controller 50, a return signal from the switch 32. The method may include the secondary controller 50 determining whether the position of the first switch 32 has changed (e.g., between a first position, a second position, and/or a third position). Determining whether the position of the first switch 32 changed may include storing a first value corresponding to a first return signal, storing a second value corresponding to a second return signal, and determining that the position has changed if the first value and the second value are different. The method may include the secondary controller 50 controlling the primary controller 40. Controlling the primary controller 40 may include activating/turning on the primary controller 40, such as by connecting a power source 38 of the secondary controller 50 to the primary controller 40 if the first switch 32 changes from the first position to the second position or the third position. Controlling the primary controller 40 may include the secondary controller 50 receiving a signal from the primary controller 40 to disconnect the power source 38 from the primary controller 40 (or activate a low power mode of the primary controller 40). The secondary controller 50 may disconnect the power source 38 from the primary controller 40 when the first switch 32 is in the first position. The method may include the primary controller 40 receiving an analog signal from the first switch 32 and/or converting the analog signal into a digital signal/value. The digital value may correspond to a direction and/or amount of seat movement.

With embodiments, a primary controller 40 of an electrical assembly 20 may include both an analog input and a digital input, and/or an input that may be switched between analog and digital modes. With such embodiments, the primary controller 40 may be configured to perform the same or similar functions as a secondary controller 50, and/or an electrical assembly 20 may not include a secondary controller 50.

It should be understood that while embodiments of electrical assemblies 20 may be described herein in connection with a vehicle seat 22 for illustrative purposes, electrical assemblies 20 may be utilized in connection with other applications, including applications that do not involve vehicles or seats.

In embodiments, a controller (e.g., the primary controller 40 and/or the secondary controller 50) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

It should be understood that a controller, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having both ROM, RAM, a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute one or more processors, multiple processors that are integrated into a single system or are distributed over and connected together through a communications network, and/or where the network may be wired or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, including:
   a primary controller;
   a secondary controller; and
   a switch assembly;
   wherein the primary controller, the secondary controller and the switch assembly are electrically connected;
   the secondary controller is configured to control the primary controller according to a position of a switch of the switch assembly;
   the switch assembly is connected to the primary controller, and the primary controller is configured to control movement of a vehicle seat according to the position of the switch.

2. The electrical assembly of claim 1, wherein the secondary controller is configured to provide a monitoring signal to the switch assembly; and
   the switch assembly is configured to provide a return signal to the secondary controller; and
   the secondary controller is configured to change the primary controller from a first state to a second state according to the return signal.

3. The electrical assembly of claim 1, wherein the primary controller includes one or more analog to digital converters; and
   the one or more analog to digital converters are configured to convert return signals from the switch assembly from analog signals to digital signals.

4. The electrical assembly of claim 1, wherein the secondary controller includes a processor and one or more digital inputs; and
   the one or more digital inputs include a first threshold and a second threshold.

5. The electrical assembly of claim 4, wherein when a return signal from the switch assembly is greater than the first threshold, the secondary controller is configured to maintain the primary controller in a first state or change the primary controller from a second state to the first state.

6. The electrical assembly of claim 5, wherein when the return signal from the switch assembly is less than the second threshold; and the secondary controller is configured to maintain the primary controller in the second state or change the primary controller from the first state to the second state.

7. The electrical assembly of claim 1, wherein the secondary controller is configured to send a cyclic monitoring signal to the switch assembly; and the secondary controller is configured to compare a first value corresponding to a return signal from the switch assembly with a second value corresponding to a previous return signal from the switch assembly.

8. The electrical assembly of claim 7, wherein if the first value is different than the second value, the secondary controller is configured to change a state of the primary controller.

9. The electrical assembly of claim 1, wherein the switch assembly includes a first switch; and the first switch includes an input, an output, a first resistor, a second resistor, and a third resistor.

10. The electrical assembly of claim 9, wherein the first switch is configured to move between a first position, a second position, and a third position; in the first position, the input is connected to the output via the first resistor, the second resistor, and the third resistor in series; in the second position, the input is connected to the output via the first resistor and the second resistor in series; and, in the third position, the input is connected to the output via the first resistor.

11. The electrical assembly of claim 10, wherein a first output resistor is connected between a first output of the secondary controller and the input of the switch assembly; and a first input resistor is connected between the output of the switch assembly and a first input of the secondary controller.

12. The electrical assembly of claim 1, wherein the secondary controller is configured to selectively supply power to the primary controller.

13. An electrical assembly including:
    a primary controller;
    a secondary controller; and
    a switch assembly;
    wherein the primary controller, the secondary controller and the switch assembly are electrically connected;
    the secondary controller is configured to control the primary controller according to a position of a switch of the switch assembly;
    the primary controller has a first state and a second state; and
    the primary controller is configured to instruct the secondary controller to change the primary controller from the second state to the first state.

14. The electrical assembly of claim 13, wherein the secondary controller is configured to selectively supply power to the primary controller.

15. The electrical assembly of claim 13, wherein the first state of the primary controller includes the primary controller being disconnected from a power source.

16. A method of operating an electrical assembly, the method comprising:
providing a primary controller, a secondary controller, and a first switch;
receiving, at a digital input of the secondary controller, an analog return signal from the first switch;
determining a position of the first switch based on the analog return signal; and
selectively providing power to the primary controller via the secondary controller based on the position of the first switch.

17. The method of claim 16, wherein the first switch has a first position, a second position, and third position; and the secondary controller is configured to provide power to the primary controller if the first switch changes from the first position to the second position, and/or if the first switch changes from the first position to the third position.

18. The method of claim 16, wherein the secondary controller is configured to send a cyclic power signal to the first switch.

19. The method of claim 16, wherein the secondary controller is configured to receive a signal from the primary controller to activate a low power mode of the primary controller.

20. The method of claim 16, wherein the primary controller is configured to receive an analog signal from the first switch;
the primary controller may be configured to convert the analog signal into a digital signal; and
the primary controller is configured to move a seat based on the digital signal.

* * * * *